(12) United States Patent
Alivisatos et al.

(10) Patent No.: US 7,972,437 B2
(45) Date of Patent: *Jul. 5, 2011

(54) HOLLOW NANOCRYSTALS AND METHOD OF MAKING

(75) Inventors: A. Paul Alivisatos, Oakland, CA (US); Yadong Yin, Moreno Valley, CA (US); Can Kerem Erdonmez, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 845 days.

This patent is subject to a terminal disclaimer.

(21) Appl. No.: 10/599,252

(22) PCT Filed: Oct. 12, 2004

(86) PCT No.: PCT/US2004/033581
§ 371 (c)(1),
(2), (4) Date: Apr. 20, 2007

(87) PCT Pub. No.: WO2005/094230
PCT Pub. Date: Oct. 13, 2005

(65) Prior Publication Data
US 2009/0142522 A1 Jun. 4, 2009

Related U.S. Application Data

(60) Provisional application No. 60/555,590, filed on Mar. 22, 2004.

(51) Int. Cl.
*C30B 29/66* (2006.01)

(52) U.S. Cl. .................. 117/2; 117/3; 423/328.2; 977/1

(58) Field of Classification Search .................. 117/2, 3; 423/328.2
See application file for complete search history.

(56) References Cited

U.S. PATENT DOCUMENTS

| | | | |
|---|---|---|---|
| 6,602,671 B1 * | 8/2003 | Bawendi et al. | 435/7.1 |
| 7,295,419 B2 * | 11/2007 | Chow et al. | 361/303 |
| 7,381,465 B2 * | 6/2008 | Torimoto et al. | 428/403 |
| 7,466,533 B2 * | 12/2008 | Chow et al. | 361/303 |
| 7,544,523 B2 * | 6/2009 | Schwind et al. | 438/20 |
| 7,608,237 B2 * | 10/2009 | Alexandridis et al. | 423/508 |
| 7,625,835 B2 * | 12/2009 | Li et al. | 502/216 |
| 2002/0122873 A1 * | 9/2002 | Mirkin et al. | 427/2.1 |
| 2003/0082237 A1 * | 5/2003 | Cha et al. | 424/490 |
| 2003/0235689 A1 * | 12/2003 | Rafaniello et al. | 428/403 |
| 2005/0164227 A1 * | 7/2005 | Ogura et al. | 435/6 |
| 2006/0038979 A1 * | 2/2006 | Natan et al. | 356/71 |
| 2006/0275196 A1 * | 12/2006 | Alexandridis et al. | 423/509 |
| 2006/0279905 A1 * | 12/2006 | Chow et al. | 361/508 |
| 2007/0237460 A1 * | 10/2007 | Fan et al. | 385/39 |

(Continued)

OTHER PUBLICATIONS

Yin et al "Formation of Hollow Nanocrystals Through the Nanoscale Kirkendall Effect", Mar. 11, 2004, Lawrence Berkeley National Laboratory, eScholarship University of California, pp. 1-18.*

(Continued)

*Primary Examiner* — Robert M Kunemund
(74) *Attorney, Agent, or Firm* — Leonard T. Guzman; EO Lawrence Berkeley National Laboratory

(57) ABSTRACT

Described herein are hollow nanocrystals having various shapes that can be produced by a simple chemical process. The hollow nanocrystals described herein may have a shell as thin as 0.5 nm and outside diameters that can be controlled by the process of making.

33 Claims, 5 Drawing Sheets

U.S. PATENT DOCUMENTS

| | | | |
|---|---|---|---|
| 2008/0035021 A1* | 2/2008 | Sambasivan et al. | 106/286.5 |
| 2008/0226934 A1* | 9/2008 | Alivisatos et al. | 428/570 |
| 2009/0142522 A1* | 6/2009 | Alivisatos et al. | 428/34.1 |
| 2009/0263485 A1* | 10/2009 | Li et al. | 424/489 |

OTHER PUBLICATIONS

Caruso, et al., "Nanoengineering of Inorganic and Hybrid Hollow Spheres by Colloidal Templating," Science, vol. 282 ( No. 5391), p. 1111-1114, (Nov. 6, 1998).

Sun, et al., "Shape-Controlled Synthesis of Gold and Silver Nanoparticles," Science, vol. 298, p. 2176-2179, (Dec. 13, 2002).

Smigelskas, et al., "Zinc Diffusion in Alpha Brass," Transactions AIME (Atlantic City Meeting), vol. 171, p. 130-142, (Nov. 1946).

Murray, et al., "Synthesis and Characterization of Monodisperse Nanocrystals and Close-Packed Nanocrystal Assemblies," Annual Review of Material Science, vol. 30, p. 545-611, (Aug. 2000).

Puntes, et al., "Colloidal Nanocrystal Shape and Size Control: The Case of Cobalt," Science Magazine, vol. 291, p. 2115-2117, (Mar. 16, 2001).

Ghoniem, et al., "Theory and Experiment of Nanostructure Self-Organization in Irradiated Materials," Journal of Computer-Aided Material Design, vol. 8, p. 1-38, (Jun. 29, 2001).

Mrowec, et al., "Sulphidation of Cobalt at High Temperature," Journal of Material Sciences, vol. 33, p. 2617-2628, (1998).

Aldinger, "Controlled Porosity by an Extreme Kirkendall Effect," ACTA Metallurgica, vol. 22 ( No. 7), p. 923-928, (Jul. 1974).

Puntes, et al., "Synthesis of hcp-Co Nanodisks," Journal of the American Chemical Society, vol. 124 ( No. 43), p. 12874-12880, (Jun. 11, 2002).

Luo, et al., "Shape-Controlled Synthesis of $Cu_2O$ Nanocrystals Assisted by Triton X-100," Journal of Crystal Growth, vol. 285 ( No. 4), p. 534-540, (Dec. 15, 2005).

Cao et al.,"A controllable synthetic route to Cu, $Cu_2O$, and CuO nanotubes and nanorods," Chemical Communications, pp. 1884-1885, (2003).

* cited by examiner

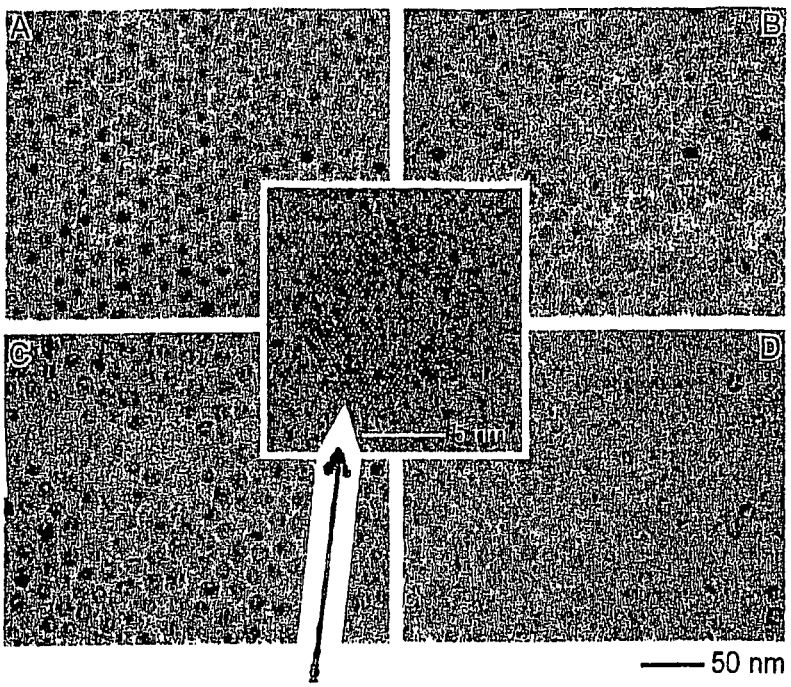
FIG 2A
FIG 2B
FIG 2C
FIG 2F
FIG 2D
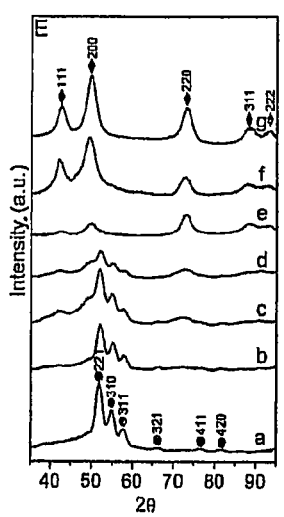
FIG 2E

— 20 nm

US 7,972,437 B2

HOLLOW NANOCRYSTALS AND METHOD OF MAKING

PRIORITY

This application claims priority to U.S. Provisional applications 60/555,590, filed Mar. 22, 2004, the contents of which are incorporated herein by reference for all purposes.

STATEMENT AS TO RIGHTS TO INVENTIONS MADE UNDER FEDERALLY SPONSORED RESEARCH OR DEVELOPMENT

The invention described and claimed herein was made in part utilizing funds supplied by the United States Department of Energy under contract NO. DE-AC03-76SF000-98 between the United States Department of Energy and The Regents of the University of California. The government has certain rights to the invention.

BACKGROUND OF THE INVENTION

Porous solid materials are important in many areas of modern science and technology, including ion exchange, molecular separation, catalysis, chromatography, microelectronics, and energy storage. Notable examples are microporous (<2 nm) zeolites and mesoporous (2-50 nm) silicate and carbonaceous materials. The ability to manipulate the structure and morphology of porous solids on a nanometer scale would enable greater control of chemical reactions.

Previous studies on the interdiffusion of 30-micrometer powders with layered composition showed significant porosity, but the geometry and distribution of the pores were not uniform, probably due to aggregation and still bulk-like dimension of the particles. Recently, significant progress has been made in synthesizing colloidal nanocrystals with well-controlled size, shape and surface properties.

Hollow particles of silica have been made with diameters between 720 and 1000 nm, see Science, Vol 282, Issue 5391, 1111-1114, 6 Nov. 1998, the contents of which are hereby incorporated by reference in its entirety for all purposes.

Gold single crystalline nanoboxes have been made, though not on the nanoscale size dimension as taught by the present invention, see Y. Sun, Y. Xia, Science 298, 2176 (2002), the contents of which are hereby incorporated herein in its entirety for all purposes.

SUMMARY OF THE INVENTION

In one embodiment of the present invention there is a hollow nanocrystal, comprising a nanocrystal shell having a thickness of at least 0.5 nm, said nanocrystal shell enveloping an empty space wherein said nanocrystal shell is not perfectly single crystalline. In a preferred embodiment the hollow nanocrystal has a shell thickness of between about 0.5 nm and 100 nm. In a more preferred embodiment the hollow nanocrystal has a shell thickness between about 2 nm and 80 nm. In a more preferred embodiment the shell thickness is between about 3 nm and 10 nm. In one embodiment the hollow nanocrystal shell comprises a material selected from the group consisting of Pt, ZnS, ZnSe, ZnTe, ZnO, CoO, $Co_3O_4$, $Fe_2O_3$, FeP, $Fe_3O_4$, FeO, $TiO_2$, CdS, CdSe, CdTe, HgS, HgSe, HgTe, MgTe, GaN, GaP, GaAs, GaSb, InN, InP, InAs, InSb, AlAs, AlP, AlSb, AlS, $Co_9S_8$, $Co_3S_4$, CoSe, GaMnAs, GaIN and InAsN. In one embodiment of the present invention the shape of the hollow nanocrystal is either spherical, branched, tubular or disk. In one embodiment of the present invention the outside diameter of a spherical hollow nanocrystal is between about 1 nm and 500 nm. Preferably the outside diameter is between 5 nm and 100 nm. More preferably the outside diameter is between 10 nm and 50 nm. Even more preferably the outside diameter is between 10 nm and 30 nm. In another embodiment of the invention the hollow nanocrystal shell comprises a binary or ternary compound, wherein said binary and/or ternary compound comprises a first material and a second material, wherein the first material comprises a material selected from the group consisting of Pt, Zn, Co, Fe, Ti, Cd, Hg, Mg, Ga, In, Al, Ni, Sn and Bi; and the second material is selected from the group consisting of S, Se, 0, P, N, F, Cl, I, Br, As and Sb. In a preferred embodiment the diffusion rate for the first material is different than the diffusion rate for the second material. In one embodiment of the present invention the nanocrystal has a disk shape, and the outside diameter is between about 10 nm to about 200 nm. In a preferred embodiment, the outside diameter of the disk is between about 10 nm and 100 nm. In a more preferred embodiment the outside diameter is between about 25 nm and 50 nm. In another embodiment of the present invention the nanocrystal has a tubular shape, and the length is between about 30 nm to about 500 nm. In a preferred embodiment the length is between about 50 nm and 200 μm. In a more preferred embodiment the length is between about 50 nm and 20 μm.

The present invention contemplates a method of making a hollow nanocrystal, comprising providing a nanocrystal comprising a first material, reacting the nanocrystal with a second material, wherein the first and second material react to form a shell of a hollow nanocrystal. In a preferred embodiment the first material comprises a material chosen from the group consisting Al, Ga, In, Tl, Sn, Pb, Bi, Po, Sc, Ti, V, Cr, Mn, Fe, Co, Ni, Cu, Y, Zr, Nb, Mo, Tc, Ru, Rh, Pd, Ag, Cd, La, Hf, Ta, W, Re, Os, Ir, Pt, Au, Hg, Li, Na, K, Rb, Cs, Be, Mg, Ca, Sr, Ba, Ge, Si, Se, Te, FeCo, CoNi and CdZn. In another embodiment the second material comprises a material chosen from the group consisting of S, O, Se, Te, P, N, As, Cl, I, Br and Bi. In one embodiment of the present invention the second material comprises sulfur in solution, and the second material is combined with a solution containing the first material to make a sulfide hollow nanocrystal. In another embodiment the second material comprises O, and a gaseous mixture containing the second material is combined with a solution containing the first material, thereby making a oxide hollow nanocrystal compound. In another embodiment the second material comprises O, and the second material is in solution and is combined with a solution containing the first material, thereby making an oxide hollow nanocrystal compound.

BRIEF DESCRIPTION OF THE DRAWINGS

FIGS. 2A-2F show evolution of CoO hollow nanocrystals with time by blowing a stream of $O_2$/Ar (1:4 in volume ratio, 120 ml/min) mixture through a cobalt colloidal solution at 455 K. (A-D) TEM images of the solutions after flowing $O_2$/Ar for (A) 0 min; (B) 30 min; (C) 80 min; (D) 210 min. (F) shows a HRTEM of a CoO hollow nanocrystal. (E) XRD patterns of the sample obtained from the solution after flow $O_2$/Ar for (a) 0 min; (b) 2.5 min; (c) 5.5 min; (d) 10 min; (e) 30 min; (f) 80 min; and (g) 210 min.

DETAILED DESCRIPTION OF THE PREFERRED EMBODIMENTS

Figure 1A:
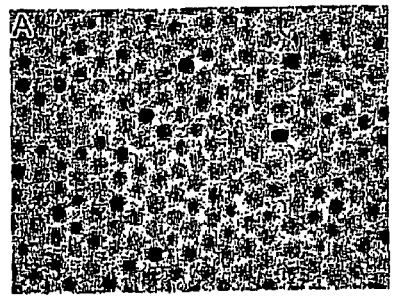
FIGS. 1A-1F show (A) TEM image of Co nanocrystals synthesized by injecting 0.54 g of $Co_2(CO)_8$ in 3 ml of o-dichlorobenzene into 0.1 ml of oleic acid and 0.1 g of trioctylphosphine oxide in 15 ml of o-dichlorobenzene at 455 K. (B,D) TEM images of the cobalt sulfide phases synthesized by injecting sulfur in o-dichlorobenzene (5 ml) into cobalt nanocrystal solution with different Co/S molar ratios: (B) $Co_3S_4$ with Co:S=9:12 and (D) $Co_9S_8$ with Co:S=9:8. The $Co_3S_4$ particles were synthesized from the Co sample shown in (A), while the $Co_9S_8$ particles started from another Co sample which has an average diameter around 11 nm. (C,F) HRTEM images of $Co_3S_4$ (C) and $Co_9S_8$ (F). (E) XRD patterns of cobalt nanocrystals (a) and cobalt sulfide synthesized with different Co/S molar ratios: (b) 9:5; (c) 9:7; (d) 9:8; (e) 9:10; (f) 9:11; (g) 9:12; and (h) 9:18.

By "providing a nanocrystal" it is meant any step, process or manipulation that produces a nanocrystal capable of entering into a reaction or process. Typically this step is synthetic, and the nanocrystals are in solution after synthesis. This step may be accomplished by purchasing commercially available nanocrystals.

By "bulk" or "bulk systems" it is meant materials not on the nanoscale size dimension.

By "disk shaped" or "disk" it is meant a relatively cylindrical structure having size dimensions as defined herein.

By "tube shaped" or "tubular" and "tube(s)" it is meant a structure that has a hollow cylindrical shape. The cylinder is not required to be uniform in diameter. It is understood that the tube has two ends that are closed. However, during synthesis it is possible for the ends to become open by accidental fracture.

By "nanocrystal" it is meant to include all shapes, including spheres, disks, tubes, tetrapods, branched and unbranched nanocrystals.

By "core" as recited herein it is meant the first material, also termed the main starting material in the present invention, also termed the preliminary main material. The core material is an element, a compound or a composition that is a nanocrystal.

By "reaction" it is meant to include not only chemical reactions, but also alloy formation.

By "not perfectly single crystalline" it is meant that there are at least grain boundries or other defects in the nanocrystal shell.

By "envelop" it is meant to enclose completely with or as if with a covering. This definition allows for the presence of grain boundries due to polycrystalline materials.

The hollow nanospheres produced in accordance with the present invention have outside diameters of between about 1 nm-1000 nm. In a preferred embodiment the nanospheres have outside diameters of between 1 nm-500 nm and more preferred is about 5 nm-100 nm, even more preferred are 10 nm-50 nm, and even more preferred are 10 nm-30 nm. In one embodiment hollow nanotubes have outside diameters of between about 1 nm-1000 nm, preferably between 5 nm-500 nm, and more preferably between about 10 nm-250 nm, and even more preferably between 10 nm-100 nm. The length of hollow nanotubes in accordance with the present invention ranges from about 30 nm to 500 µm, preferably between about 30 nm-250 µm and more preferably between about 50 nm and 200 µm, even more preferably between 50 nm-20 µm. In one embodiment hollow nanodisks have diameters between 10 nm-200 nm, preferably between about 10 nm-100 nm and more preferably about 25 nm-50 nm. In one embodiment the thickness of the disk is between about 1 nm-20 nm, preferably between 2 nm-15 nm and more preferably between 3 nm-10 nm.)

The ratio of the inside diameter (id) to the outside diameter (od) for hollow nanocrystals, expressed (id)/(od), ranges from between 20-90%. As a non-limiting example CoO and CoS hollow nanospheres made in accordance with this invention have a ratio of about 40%.

The present invention contemplates that the thickness of the hollow nanocrystal wall is controllable by varying the temperature of the reaction and the concentration of the second material. In one embodiment of the invention the walls or shell of the hollow nanocrystal range between 0.5 nm and 100 nm, preferably between 2 nm-80 nm and more preferably between 3 nm-50 nm, even more preferably between about 3 nm and 10 nm. By varying the reaction temperature and concentration, the (id)/(od) for CoS may vary between 30%40% (0.3-0.4). In a preferred embodiment of the method, it is preferable to control the (id)/(od) by varying the preliminary starting nanocrystal size.

It is understood that in accordance with this invention the shell of the hollow nanocrystals form a continuous three dimensional domain adopting a three dimensional arrangement of atoms in contrast to molecular sheets such as found in graphitic, $WS_2$ or $MoS_2$ nanotubes and nanocages.

The crystallinity of the hollow nanocrystal wall, or shell is controllable. In a preferred embodiment the shell is at least partially crystalline. The advantage of a polycrystalline shell is that the defective grain boundary will allow gasses and other chemical species made of small molecules to permeate. One skilled in the art will appreciate that annealing at relatively high temperatures will eliminate many grain boundaries. In one embodiment of the present invention the hollow nanocrystals have an extremely low crystallinity, so as to be almost amorphous. The hollow nanocrystals in the present invention are not perfectly single crystalline. In a preferred embodiment the nanocrystals are at least partially polycrystalline. In a more preferred embodiment they are between 10-100% polycrystalline, and in a more preferred embodiment they are between 50 and 100% polycrystalline, and in an even more preferred embodiment they are between 75 and 100% polycrystalline. The percentages as used herein refer to the total volume fraction of the crystalline grains in the hollow nanocrystal excepting the largest crystalline grain.

In one embodiment, the present invention contemplates that novel hollow nanocrystals may be created by reacting two materials having different diffusion rates. While not wishing to be bound by any particular theory or principle, porosity may result from differential solid-state diffusion rates of the reactants in an alloying or oxidation reaction. In 1947, Smigelkas and Kirkendall reported the movement of the interface between a diffusion couple, i.e., copper and zinc in brass, as the result of the different diffusion rates of these two species at an elevated temperature, see Smigelskas et al, *Trans. AIME* 171, 130 (1947), the contents of which are hereby incorporated herein by reference in its entirety. This phenomenon, now called the Kirkendall Effect, was the first experimental proof that atomic diffusion occurs through vacancy exchange, not the direct interchange of atoms. The net directional flow of matter is balanced by an opposite flow of vacancies, which can condense into pores or annihilate at dislocations. Directional material flows also result from coupled reaction-diffusion phenomena at a solid/gas or solid/liquid interface, leading to deformation and/or void formation during the growth of metal oxide or sulfide films. These voids are usually explained by outward transport of fast-moving cations through the oxide layer and a balancing inward flow of vacancies to the vicinity of the metal-oxide interface. Interface motion and the formation of pores have been studied due to their impact on the reproducibility or reliability of solders, passivation layers, diffusion barriers etc., but not generally as a method of preparing porous materials. The pores produced at a metal-metal diffusion couple or near the metal-oxide interface of a growing oxide do not yield monodisperse, ordered arrays but form a very heterogeneous ensemble. Also, the observed volume fraction for pores is commonly much smaller than would be expected for the known material flows. These observations are a direct result of the large volume of material that vacancies can diffuse into and the large number of defects they can react with.

If the faster-diffusing species is confined into a nanocrystal 'core', termed the first material, or the main starting material in the present invention, the net rate of vacancy injection should increase dramatically due to the high surface-to-volume ratio of the particle and the absence of defects in the core. Within the small volume of a transforming nanocrystal, the supersaturated vacancy cloud is likely to coalesce into a single void.

In one embodiment of the present invention Co nanocrystals are used as the main starting material. The prior art describes chemical methods to synthesize uniform Co nanocrystals in solution, see for example, non-limiting examples in C. B. Murray, C. R. Kagan, M. G. Bawendi, *Annu. Rev. Mater. Sci.* 30, 545 (2000) and V. F. Puntes, K. M. Krishnan, A. P. Alivisatos, *Science* 291, 2115 (2001), the contents of which are hereby incorporated by reference in its entirety for all purposes. In the method of the present invention, cobalt reacts readily with other species such as sulfur and oxygen. Since cobalt is the major component in one class of superalloys, its high-temperature oxidation and sulfidation have been well studied.

In one embodiment of the present invention, sulfidation of cobalt results in hollow nanostructures. Cobalt sulfide hollow nanospheres are synthesized in one pot by injection of a solution of sulfur in o-dichlorobenzene into a hot Co nanocrystal dispersion, FIG. 1A where the Co nanocrystal is that is prepared by literature methods. At 445 K, the reaction between cobalt and sulfur completes within a few seconds, resulting in a stable black solution of cobalt sulfide nanocrystals. Confirmation has shown that hollow particles are produced at temperatures as low as 373 K. While not wishing to be bound by any particular theory or principle it appears that the chemical transformation of the surface does not disrupt the stabilization of the nanocrystals by surfactant molecules.

Figure 1B:
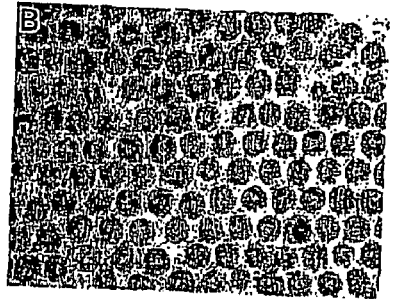
Figure 1C:
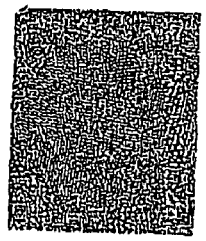
Figure 1D:
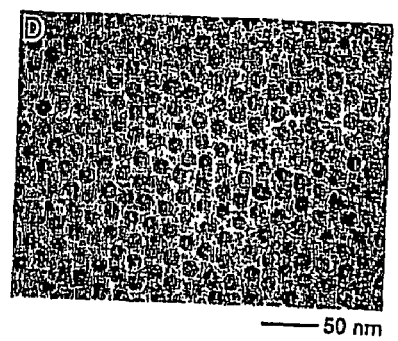
Figure 1E:
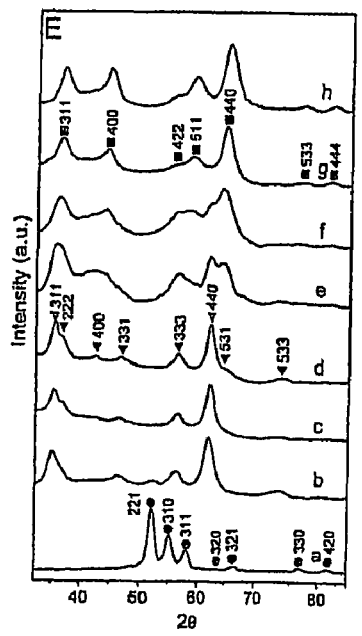
Figure 1F:
Figure 3A:
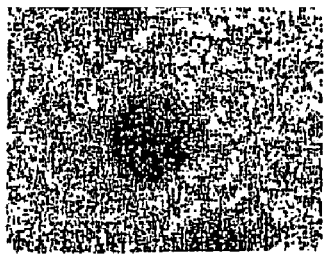
FIGS. 3A-3F show evolution of CoSe hollow nanocrystals with time by injection of a suspension of selenium in o-dichlorobenzene into a cobalt nanocrystal solution at 455 K, from (A) 0 sec, (B) 10 sec, (C) 20 sec, (D) 1 min, (E) 2 min and (F) 30 min. The Co/Se molar ratio is 1:1.
Figure 3B:
Figure 3C:
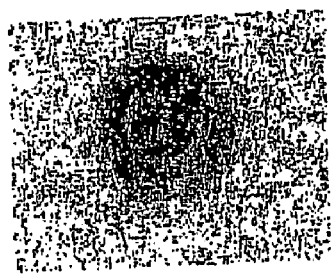
Figure 3D:
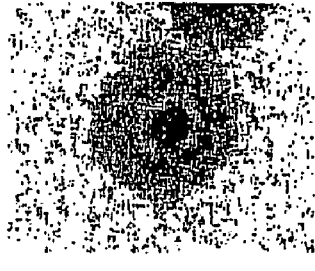
Figure 3E:
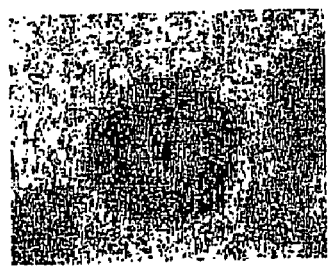
Figure 3F:
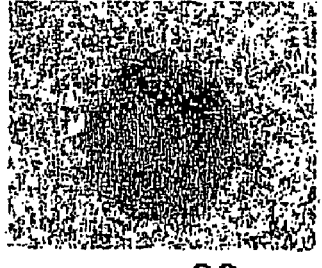
Figure 4:
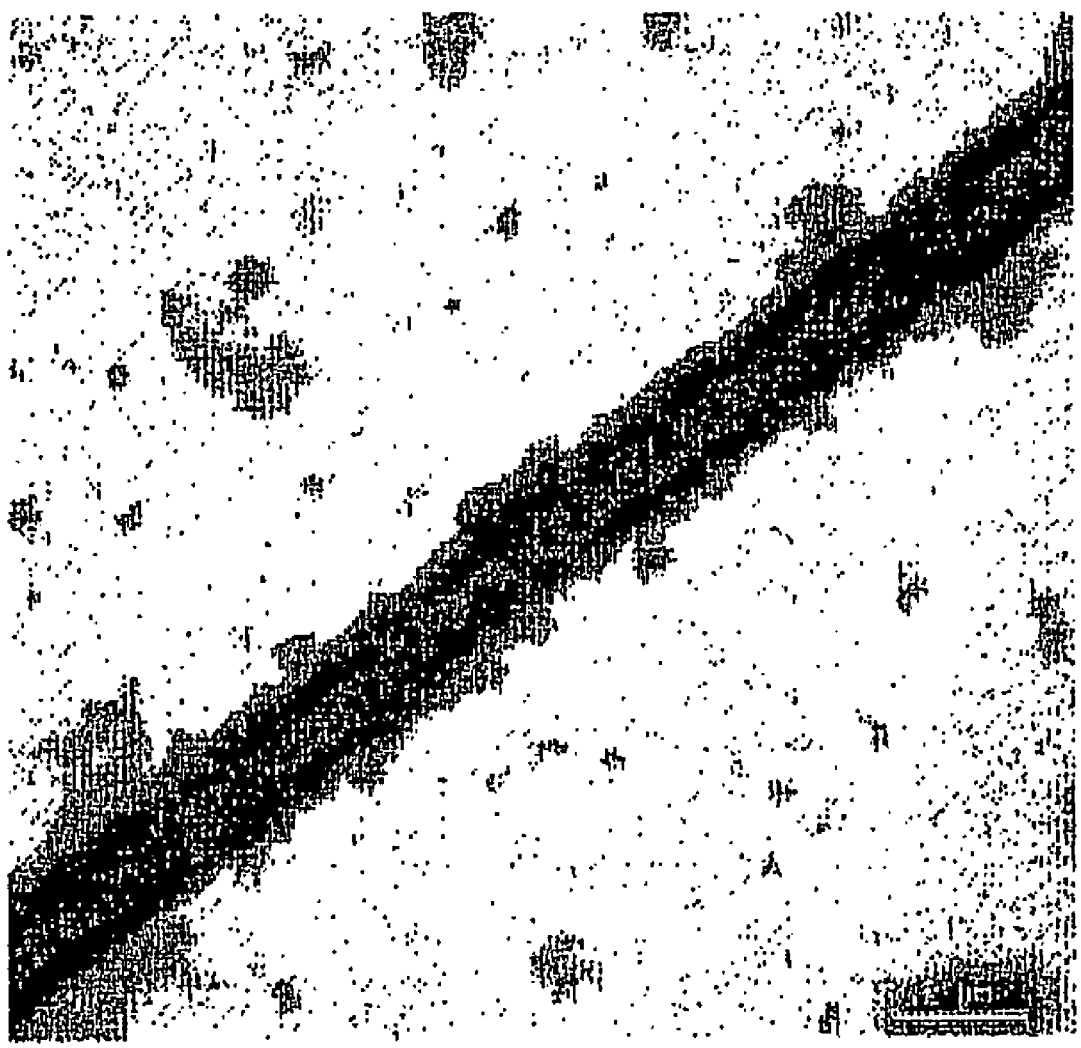
FIG. 4 shows CdS nanotubes synthesized by injecting 0.047 g sulfur solution in 3 ml of dioctyl ether into a hot cadmium nanowire solution. The cadmium nanowire solution was prepared by injecting 0.17 g of $Cd(CH_3)_2$ in 1 ml of dioctyl ether into a hot solution of 0.1 ml of oleylamine in 5 ml of dioctyl ether at 573 K.

During the reaction of the sulfur with the hot nanocrystal solution, outward flow of cobalt through the sulfide shell results in supersaturation of vacancies, which condense to form a single hole in each nanoparticle (FIGS. 1B-D). Two stable cobalt sulfide phases are observed, linnaeite ($Co_3S_4$) and cobalt pentlandite ($Co_9S_8$), depending on the sulfur-to-cobalt molar ratio used in the synthesis. One having ordinary skill in the art will be able to adjust the sulfur-to-cobalt ration to arrive at the desired composition of linnaeite and pentlandite. X-ray powder diffraction (XRD) patterns in FIG. 1E show the evolution of the crystal structure as the molar ratio of sulfur to cobalt is increased. $Co_9S_8$ is the only sulfide phase observed when the molar ratio is lower than 9:8, while $Co_3S_4$ also appears in the patterns when the molar ratio slightly exceeds this value. Only $Co_3S_4$ is obtained when the molar ratio of sulfur to cobalt is above 3:4. The size distribution of the sulfide hollow particles is similar to the starting cobalt nanocrystals.

In one embodiment of the invention, monodisperse hollow nanocrystals self-assemble into ordered hexagonal arrangements when evaporated slowly on the surface of a carbon coated TEM grid. The assembly process is driven by surface tension and van der Waals forces. Cobalt sulfide nanocrystals do not form superlattices as readily as cobalt nanocrystals do, probably due to a diminished van der Waals force and the absence of magnetic interactions among sulfide particles. Assemblies of hollow nanoparticles present a distinct topology of ordered porous materials. In terms of the accessibility of pores from the outside, they fall between mesoporous materials with accessible channels and void lattices where pores are confined in a continuous matrix, see N. M. Ghoniem, D. Walgraef, S. J. Zinkle, *J. Comput. Aided Mater. Des.* 8, 1 (2001), the contents of which are hereby incorporated by reference in its entirety for all purposes.

Kinematical diffraction simulations indicate that the XRD peaks are too broad to be consistent with a single crystal shell of dimensions observed by TEM. A satisfactory fit to the data in FIG. 1E(d) is obtained by assuming a 4.5 nm cubic crystalline domain. TEM micrographs (FIG. 1D) of the same sample show that the average outer diameter of the hollow $Co_9S_8$ nanocrystals is around 15 nm. While not wishing to be bound by any particular theory, a reasonable explanation is that the shell of each hollow sphere is multi-crystalline. This is confirmed by high resolution transmission electron microscopy (HRTEM). As shown in FIG. 1C, both $Co_9S_8$ and $Co_3S_4$ hollow nanocrystals are composed of multiple crystallographic domains. The arrangement of the domains is analogous to the columnar morphology of grains often observed in thin film growth.

In sulfidation of cobalt nanocrystals it is generally found that the diameter of the hole in the center of the hollow nanocrystals is 40-70% of the initial particle size (starting with Co particles with a size distribution of 7%, a single synthesis yields a hole size distribution of 13%). If sulfur transport through the growing shell is negligible, as shown for bulk sulfidation by marker experiments, then the two diameters are expected to be identical. While not wishing to be bound by any particular theory or principle, it is possible that significant inward sulfur transport could occur through grain boundaries or during the formation of the first few monolayers of sulfide. It is also possible that inward relaxation of the hole occurs, due to annihilation of vacancies at a semicoherent or incoherent cobalt-sulfide interface. Finally, the estimation of the hole size by visual inspection of TEM images may produce systematic errors. The possibility of inward sulfur transport is examined by performing the $Co_3S_4$ synthesis at different sulfur concentrations. Increased sulfur concentration increases hole size and enhances outward growth of the shell, indicating that cobalt mobility rather than sulfur mobility is affected. This finding is consistent with bulk sulfidation studies, where it is observed that an increased sulfur vapor pressure leads to injection of more cation vacancies into the growing sulfide and enhances the parabolic rate constant for sulfide growth.

In another embodiment of the present invention, cobalt nanocrystals are reacted with oxygen to produce hollow nanocrystals. For bulk cobalt, the rates of oxidation are 3-4 orders of magnitude lower than those of sulfidation above 750 K, see S. Mrowec, M. Danlelewski, A. Wojtowicz, *J. Mater. Sci.* 33, 2617 (1998), the contents of which are hereby incorporated by reference for all purposes. This is also true under the conditions of the present invention, and oxidation of nanocrystals takes about three hours at 455 K. FIG. 2(A-D) shows the evolution of the morphology of the nanocrystals with time as an $O_2$/Ar mixture is flowed through the cobalt colloidal solution. The XRD shows the presence of metallic cobalt up to 30 minutes (FIG. 2E). The solution of particles still displays weak ferrofluidic response to a 1 T magnet at that point, suggesting that small cobalt cores remain. It takes about three hours for the cobalt cores to be completely consumed: central pores are clearly distinguishable for all nanocrystals under TEM and the solution shows no magnetic response.

In another embodiment of the present invention, cobalt is reacted with selenium. In accordance with the present invention, the evolution of hollow morphology is best illustrated by this reaction. In bulk systems, annihilation of excess vacancies at dislocations and boundaries can produce stresses leading to the formation of cracks near the interface; the cracks then act as nuclei for the further condensation of supersaturated vacancies, see F. Aldinger, *Acta Met.* 22, 923 (1974), the contents of which are hereby incorporated by reference in its entirety for all purposes. While the exact mechanism is likely to be different, in nanocrystals voids also begin to develop and merge at the boundary (FIG. 3A-3E). The high defect content and surface energy associated with the boundary favors the nucleation of voids there. Also, as vacancies diffuse inwards, they will be more concentrated at the boundary rather than in the interior of the core. As the reaction proceeds in time, more cobalt atoms diffuse out to the shell and the accompanying transport of vacancies leads to growth and merging of the initial voids. This results in the formation of bridges of material between the core and the shell that persist until the core is completely consumed. These bridges provide a fast transport path for outward diffusion of cobalt atoms which can then spread on the inner shell surface. A similar phenomenon was observed for bulk powders.

It is preferred that the nanocrystal core used in the present invention have a minimum size because of the lower efficiency of conversion of atomic diffusion into void growth when the cores become relatively small. In a preferred embodiment the minimum size is 5 nm for the core. Most of the pore volume seems to form during the first few minutes, while it takes about 30 minutes for the cobalt cores to completely disappear. This may be due to the fact that as the bridges are also consumed during the reaction, a smaller cross-sectional area is available for solid-state transport of materials.

Figure 5:
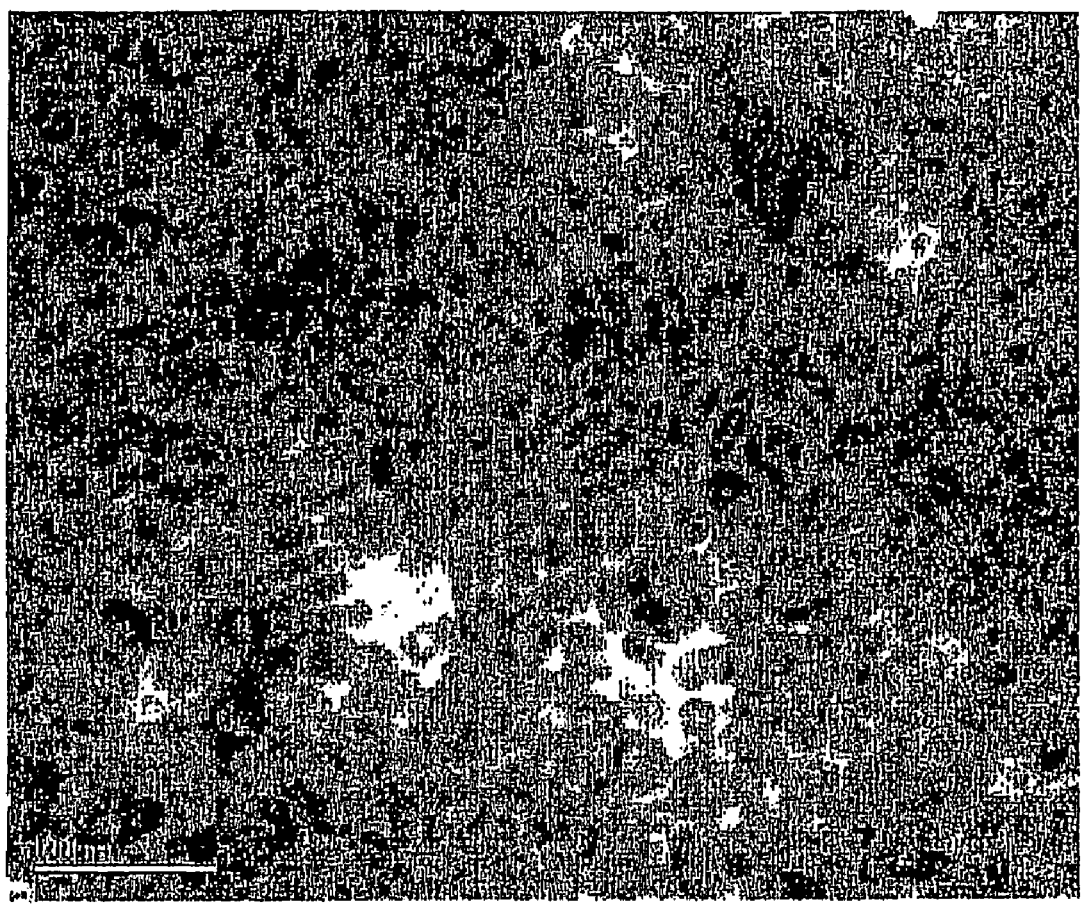
FIG. 5 shows $Co_9S_8$ disk-shaped hollow nanocrystals synthesized by injecting sulfur in o-dichlorobenzene (5 ml) into a disk-shaped cobalt nanocrystal solution with Co/S molar ratio of 9:8 at 455 K. The Co nanodisks were synthesized by injecting 0.54 g of $Co_2(CO)_8$ in 3 ml of o-dichlorobenzene into a hot solution of 0.1 ml of oleic acid, 0.61 g hexadecylamine and 0.1 g of trioctylphosphine oxide in 15 ml of o-dichlorobenzene at 455 K.

Disk shaped hollow nanocrystals may be made in accordance with one embodiment of this invention. The starting material or first nanocrystal must have a disk shape. Disk shaped Co nanocrystals may be made according to the prior art methods such as V. F. Puntes, D. Zanchet, C. K. Erdonmez, A. P. Alivisatos, *J. Am. Chem. Soc.* 124, 12874 (2002), the contents of which are hereby incorporated by reference in its entirety for all purposes. In one embodiment of the present invention, sulfidation of disk-shaped Co nanocrystals was observed to result in the formation of hollow nanodisks with cylindrical pores, see FIG. 5, indicating that spherical symmetry is not required for obtaining shells of regular thickness.

In one embodiment of the present invention, it is contemplated that metal core materials may be used as preliminary main materials for hollow nanocrystals. It is to be understood that the formation of the metal core material used as a preliminary main material is known in the prior art, and is not the subject of this invention. The prior art appreciates that various sizes of particles can be made using different techniques, for example varying the amount of surfactant, usually with a greater amount of surfactant leading to smaller particles.

The present invention contemplates that the core material may be coated with a thin layer of a second material. Upon heating at a sufficient temperature, diffusion will occur and result in a hollow nanocrystal.

The core material used as a preliminary main material may be elemental or an alloy. In a preferred embodiment the core material used as a preliminary main material for the formation of hollow nanocrystals be elemental. Metals include the main group metals, Al, Ga, In, Tl, Sn, Pb, Bi and Po; the transition metals Sc, Ti, V, Cr, Mn, Fe, Co, Ni, Cu, Y, Zr, Nb, Mo, Tc, Ru, Rh, Pd, Ag, Cd, La, Hf, Ta, W, Re, Os, Ir, Pt, Au, Hg, the alkali and alkaline earth metals Li, Na, K, Rb, Cs, Be, Mg, Ca, Sr, Ba and the semiconductor metals Ge, Si, Se, Te. Alloys include, but are not limited to FeCo, CoNi and CdZn. It would not be possible to obtain structures containing carbon as the major constituent material, but various carbon nanostructures, including diamond nanoparticles or carbon nanotubes may be utilized as the starting material and reacted with other species to obtain carbon-alloyed hollow nanostructures, for example hollow nanospheres of steel may be synthesized by reacting a diamond nanospheres with a suitable iron source. This resulting structure will be chemically and crystallographically very different from sheet-like structures such as buckministerfullerenes or carbon nanotubes. Halogens and noble gases are not suitable. One having ordinary skill in the art will appreciate that the stability and reactivity of the core material in solution and under reaction conditions will impact on the success of the present method and the quality of the hollow nanocrystals derived therefrom. For example, alkali earth metals are less stable and would require more stringent reaction conditions for success.

The material chosen to react with the metal core material used as a preliminary main material does not have to be elemental. It is only required that the material be capable of donating that element or compound of interest. As a non-limiting example, for the sulfidation of Co, all that is required is a compound capable of donating sulfur. One skilled in the art will readily appreciate without undue experimentation the compositions capable of donating sulfur in the reaction solution.

As non-limiting examples, hollow nanocrystals in accordance with the present invention may comprise ZnS, ZnSe, ZnTe, ZnO and other oxides of the core materials such as CoO, $Co_3O_4$, $Fe_2O_3$, $TiO_2$ and $Al_2O_3$; Cd cores may produce cadmium hollow nanocrystals such as CdS by sulfidation; other non-limiting examples of sulfur compounds include those of other metals including Ni, such as $Ni_5S_2$; other Ni compounds include $Ni_2Si$, NiSi and $NiCl_2$; other cadmium compounds include CdSe, CdTe, etc.; though difficult, Hg cores may produce hollow, HgS, HgSe, HgTe; other hollow nanocrystals include MgTe and the like, GaN, GaP, GaAs, GaSb, InN, InP, InAs, InSb, AlAs, AlP, AlSb, AlS, and the like, $Co_9S_8$, $Co_3S_4$ and CoSe. Also included are ternary material systems such as GaMnAs, GaInN and InAsN.

In accordance with the present invention, the mobilities of the reacting species, the first material and the second material are not necessarily chosen such that they are drastically different to result in vacancy transport. The invention contemplates that placing solid nanocrystals containing one reactant in a comparatively dilute solution creates an additional asymmetry that may favor the creation of hollow structures: the relatively large change in the concentration of the core material between the core and the solution provides a greater driving force for the outward diffusion of the core material. Thus numerous combinations of reactants will produce various hollow nanostructure shells functioning as insulators, semiconductors and even metals.

Hollow nanocrystals offer exciting possibilities in material design for applications in catalysis, nanoelectronics, nano-optics, drug delivery systems, and as building blocks for light-weight structural materials.

EXAMPLES

Example 1

Synthesis of Cobalt Pentlandite Hollow Nanocrystals ($Co_9S_8$)

0.54 g of $Co_2(CO)_8$ in 3 ml of o-dichlorobenzene was rapidly injected into a hot solution of 0.1 ml of oleic acid and 0.1 g of trioctylphosphine oxide in 15 ml of o-dichlorobenzene at 455 K. The decomposition of $Co_2(CO)_8$ leads to the formation of cobalt nanocrystals having sizes approximately 10 nm. After approximately one minute, 0.085 g sulfur solution in 5 ml o-dichlorobenzene was injected into the hot cobalt nanocrystal solution. The reaction was stopped after about two minutes by cooling the system to room temperature. TEM measurement shows the hollow morphology of the nanocrystals and XRD analysis proves the material to be $Co_9S_8$. The size was about 15 nm.

Example 2

Synthesis of Linnaeite ($Co_3S_4$) Hollow Nanocrystals

Co nanocrystals were prepared as described in Example 1. After 1 min, 0.128 g sulfur solution in 5 ml o-dichlorobenzene was injected into the hot cobalt nanocrystal solution. The reaction was stopped after about two minutes by cooling the system to room temperature. TEM measurement shows the hollow morphology of the nanocrystals and XRD analysis proves the material to be $Co_3S_4$. The size was about 15 nm.

Example 3

Synthesis of Cobalt Oxide (CoO) Hollow Nanocrystals

Co nanocrystals were prepared as described in Example 1. After 1 min, a stream of $O_2$/Ar (1:4 in volume ratio, 120 ml/min) mixture was blown through a cobalt colloidal solution at 455 K for 210 minutes. The reaction is stopped by cooling the system to room temperature. TEM measurement shows the hollow morphology of the nanocrystals and XRD analysis proves the material to be CoO. The size was about 15 nm.

Example 4

Synthesis Cobalt Oxide ($Co_3O_4$) Hollow Nanocrystals

Co nanocrystals were prepared as described in Example 1. After 1 min, a suspension of 0.45 g Trimethylamine N-oxide in 5 ml o-dichlorobenzene is injected into the hot cobalt nanocrystal solution. The reaction is stopped after two minutes by cooling the system to room temperature. TEM measurement shows the hollow morphology of the nanocrystals and XRD analysis proves the material to be $Co_3O_4$. The size was about 15 nm.

Example 5

Synthesis of Cobalt Selenide (CoSe) Hollow Nanocrystals

Co nanocrystals were prepared as described in Example 1. After 1 min, a suspension of 0.237 g selenium in 5 ml o-dichlorobenzene is injected into the hot cobalt nanocrystal solution. The reaction was stopped after about 30 minutes by cooling the system to room temperature. TEM measurement shows the hollow morphology of the nanocrystals and XRD analysis proves the material to be CoSe. The size was about 15 nm.

Example 6

Synthesis of Cadmium Sulfide (CdS) Hollow Spherical Nanocrystals 0.157 g of dimethyl cadmium ($Cd(CH_3)_2$) in 1 ml of dioctyl ether was rapidly injected into a hot solution of 0.4 ml of oleic acid in 5 ml of dioctyl ether at 455 K. The decomposition of $Cd(CH_3)_2$ leads to the formation of cadmium spherical nanocrystals approximately 25 nm in diameter. After approximately two hours, 0.07 g sulfur solution in 5 ml of dioctyl ether was injected into the hot cadmium nanocrystal solution. The synthesis was carried out under an argon atmosphere. The reaction was stopped after about two hours by cooling the system to room temperature. TEM measurement shows the hollow morphology of the spherical nanocrystals and XRD analysis proves the material to be CdS. The size was about 40-50 nm.

Example 7

Synthesis of Iron Oxide ($\alpha$-$Fe_2O_3$) Hollow Spherical Nanocrystals 0.4 g of $Fe(CO)_5$ in 3 ml of o-dichlorobenzene was rapidly injected into a hot solution of 0.05 ml of oleic acid and 0.1 g of trioctylphosphine oxide in 15 ml of o-dichlorobenzene at 455 K. The decomposition of $Fe(CO)_5$ leads to the formation of spherical iron nanocrystals having sizes approximately 10 ml. After approximately 160 minutes, a stream of $O_2$/Ar (1:4 in volume ratio, 120 ml/min) mixture was blown through the iron colloidal solution at 455 K for 260 minutes. The reaction was then stopped by cooling the system to room temperature. TEM measurement shows the hollow morphology of the nanocrystals and XRD analysis proves the material to be $\alpha$-$Fe_2O_3$.

Example 8

Synthesis of Cobalt Sulfide ($Co_9S_8$) Hollow Disk-shape Nanocrystals 0.54 g of $Co_2(CO)_8$ in 3 ml of o-dichlorobenzene was rapidly injected into a hot solution of 0.1 ml of oleic acid, 0.6 g hexadecylamine and 0.1 g of trioctylphosphine oxide in 15 ml of o-dichlorobenzene at 455 K. The decomposition of $Co_2(CO)_8$ leads to the formation of cobalt disk-shape nanocrystals approximately 5 nm in thickness and 30 nm in diameter. After approximately one minute, 0.085 g sulfur solution in 5 ml o-dichlorobenzene was injected into the hot cobalt nanocrystal solution. The synthesis was carried out under an Argon atmosphere. The reaction was stopped after about two minutes by cooling the system to room temperature. TEM measurement shows the hollow morphology of the disk-shape nanocrystals and XRD analysis proves the material to be $Co_9S_8$.

Example 9

Synthesis of Cadmium Sulfide (CdS) Hollow Nanotubes 0.17 g of $Cd(CH_3)_2$ in 1 ml of dioctyl ether was rapidly injected into a hot solution of 0.1 ml of oleylamine in 5 ml of dioctyl ether at 573 K. The decomposition of $Cd(CH_3)_2$ leads to the formation of cadmium nanowires approximately 50-150 nm in diameter and up to 100 μm in length. After approximately 90 minutes, 0.047 g sulfur solution in 3 ml of dioctyl ether was injected into the hot cadmium nanowire solution. The synthesis was carried out under an argon atmosphere. The reaction was stopped after about 15 minutes by cooling the system to room temperature. TEM measurement shows the hollow morphology of the nanotubes and XRD analysis proves the material to be CdS.

Example 10

Synthesis of Platinum Hollow Nanocrystals

Cobalt nanocrystals may be made as described in Example 1. After 1 min, a solution of platinum acetylacetonate in 5 ml o-dichlorobenzene may be injected into the hot cobalt nanocrystal solution. The redox reaction between the metallic cobalt core and platinum cations will resulted in the formation of hollow platinum nanocrystals.

Example 11

Synthesis of Nickel Silicides Nanotubes

An array of Si nanowires can be synthesized using well-known VLS methods. The nanowires can be coated by exposing the array to a suitable source of metallic Ni, such as Ni vapor in a vapor deposition chamber or preferably a hot solution of an organometallic precursor, such as $Ni(CO)_4$ or $Ni(COD)_2$, dissolved in an organic solvent, such as o-dichlorobenzene. Annealing such coated nanowires in the temperature range 250-400° C. will yield hollow tubes of a compound whose specific composition (e.g. $Ni_5Si_2$, $Ni_2Si$, NiSi) determined by the relative amounts of Si and Ni before the anneal.

Example 12

Synthesis of Nickel Chloride ($NiCl_2$) Hollow Nanocrystals

Ni nanocrystals can be prepared by a thermal decomposition method which is similar to the process in synthesizing Co nanocrystals as described in Example 1. An organometallic precursor such as $Ni(CO)_4$ dissolved in an organic solvent, such as toluene can be injected into a hot solution of oleic acid and trioctylphosphine oxide in toluene. The decomposition of the precursor will lead to the formation of Ni nanocrystals. Hollow $NiCl_2$ can be produced by blowing a stream of $Cl_2$ through the Ni colloidal solution.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

All patents, patent applications, and publications mentioned above are herein incorporated by reference in their entirety for all purposes. None of the patents, patent applications, and publications mentioned above are admitted to be prior art.

Preparation of Monodisperse Semiconductor Nanocrystals (NCs)

In the growth of compound semiconductor NCs, the requisite supersaturation and subsequent nucleation can be triggered by rapid injection of metal-organic precursors into a vigorously stirred flask containing a hot (~150-350° C.) coordinating solvent. The solvents usually used are mixtures of long-chain alkylphosphines $R_3P$, alkylphosphine oxides $R_3PO$ (R=butyl or octyl), alkylamines, etc (17). In the synthesis of II-VI NCs (ME where M=Zn, Cd, Hg; E=S, Se, Te), metal alkyls (dimethylcadmium, diethylcadmium, diethylzinc, dibenzylmercury) are generally selected as the group II sources. The group VI sources are often organophosphine chalcogenides ($R_3PE$) or bistrimethylsilylchalcogenides $TMS_2E$ (TMS, trimethylsilyl) (where E=S, Se, and Te). The $R_3PE$ class of reagents is usually preferred as Se and Te sources because they are easy to prepare; TMS2S is selected as the S source because it is more reactive than $R_3PS$ and is commercially available. The use of mixed precursors, for example a combination of Se and S precursors, leads to the straightforward production of alloys, although the NCs' stoichiometry does not directly reflect the precursor ratio, but rather the differential rate of precursor incorporation.

Growth of II-VI NCs is not limited to the use of $R_3P$ and $R_3PO$ as high boiling coordinating solvents. Injection of reagents into hot alkylphosphites, alkylphosphates, pyridines, alkylamines, and furans all produce NCs. Mikulec recently demonstrated that using alkylphosphoramide-tellurium precursors, in lieu of $R_3PTe$, produces CdTe NCs with much higher luminescence efficiencies (18).

The strong interaction of $R_3PO$ with Zn precursors unduly retards the growth of ZnE NCs. Although $R_3P$ may still be employed, Guyot-Sionnest and co-workers found that using alkylamines as the coordinating solvent greatly enhances the growth rate of ZnE NCs (19).

Similarly, synthesis of high-quality InP and InAs NCs has been achieved by rapidly mixing and heating of III and V precursors in high boiling, coordinating solvents. Preparations of InP and InAs NCs are now capable of yielding samples with $\sigma \leq 10\%$. Typically $InCl(C_2O_4)$ is employed as an In source with $TMS_3P$ or $TMS_3As$ in $R_3P/R_3PO$ solvents (20-22). In these III-V preparations the In precursor is present in the hot solvent prior to the injection of $TMS_3P$ or $TMS_3As$. Growth of the NCs is slow since Ostwald ripening over 1 to 6 days is required to reach the desired NC size. A wealth of other potential organometallic precursors and high-boiling coordinating solvents remain untested, thus providing opportunities for continued expansion to new NC systems.

Preparation of Monodisperse Metal NCs

The synthesis of metal colloids has been studied for over a century and yet the number of preparations yielding a size series of monodisperse metal NC samples is surprisingly small. The most established methods involve aqueous reduction of metal salts (notably Au or Ag) in the presence of citrate anions (23). These colloids are electrostatically stabilized by the adsorption of ions to the NCs' surfaces during growth. These samples have long been referred to as monodisperse, although in general $10 < \sigma < 15\%$. Flocculation of these colloids is irreversible, preventing further processing to achieve the desired $\sigma \sim 5\%$. Chemisorption of organic ligands on the surface of metal NCs is essential to permit further handling.

Schmid provides an excellent overview of the advances in metal colloid synthesis (24, 25).

A two-phase reduction method, described by Brust, Schiffrin, and co-workers, when coupled with size-selective processing produces capped Au and Ag NCs with σ~5% (26). In general, aqueous metal salts (e.g. $HAuCl_4$, $AgNO_3$, $AgClO_4$) are mixed in a toluene solution containing long-chain alkylammonium surfactants to form a two-phase system. Vigorous stirring for 1 to 3 h transfers the metal salt into the organic phase, which is then separated. A measured quantity of capping agent, typically a long-chain thiol, is added to the solution while stirring, and then a reducing agent (e.g. $NaBH_4$ or hydrazine) is rapidly added to nucleate NCs. The average NC size is coarsely tunable by adjusting the ratio of capping groups to metal salt, whereas size-selective precipitation is employed to narrow the initial size distribution. Several studies have refined the preparation of thiol capped Ag and Au NCs (27, 28).

The preparation of metal NCs in inverse micelles warrants mention. The inverse micelle method has been employed since the late 1980s for the preparation of both semiconductor and metal NCs. Although it is widely adopted, samples approaching the desired σ≦5% are rarely observed. However, Pileni and co-workers provide a notable exception by coupling the initial synthesis with extensive use of size-selective precipitation to yield high quality Ag (29), AgS (30), and more recently Co NCs (31).

Higher temperature reduction of metal salts in the presence of stabilizing agents can also be employed to produce monodisperse transition metal (e.g. Co and Ni) NCs that do not crystallize well at room temperature (RT) (32). In this general scheme metal halides or acetates are dissolved in high-boiling inert solvents (e.g. octylether, phenylether) along with a combination of $R_3P$ and longchain carboxylic acids (e.g. oleic acid). The solution of metal salts and stabilizers is vigorously stirred and heated to ~200-250° C. at which time a solution containing a strong reducing agent [e.g. $LiHB(CH_2CH_3)_3$, Na naphthalide, etc] is injected. Metal NCs nucleate and grow until the reagent is consumed. Although no Ostwald ripening is observed, NC size is coarsely tunable by the ratio of capping groups to metal salt. Size-selective precipitation yields NC samples with σ~5%. Progress has also been made in the preparation of monodisperse bimetallic NCs. For example, see the work by Bradley and co-workers (33). FIG. 2A-D shows high-resolution transmission electron microscopy (HRTEM) images of some of the NC materials that can currently be prepared and isolated.

Synthesis of Shape-Controlled CdSe

The synthesis of shape-controlled CdSe nanocrystals is among the most advanced. For instance, the preparation of a wide range of shapes, including rods, teardrops, tetrapods, and branched tetrapods, all made by relatively simple variations in surfactant composition and time variation of monomer concentration, have been recently reported (15). Three strategies from the prototypical CdSe system were used to produce Co nanocrystals with high crystallinity, narrow size distributions, and a high degree of shape control. In both cases, the nanocrystals are produced by the injection of an organometallic precursor into a hot surfactant mixture under inert (Ar) atmosphere.

The first lesson from CdSe is that an equilibrium spherical shape will be produced in the presence of a single surfactant under thermodynamic conditions because it minimizes surface area (16). Second, anisotropic particles—nanorods—are obtained by rapid growth in a surfactant mixture (under kinetic conditions), where the different surfactants are used to selectively control the growth rates of different faces (3). Lastly, in both systems it is desirable to separate nucleation from growth via a rapid injection of the precursor. Tight size distributions can be obtained spontaneously when monomers can exchange between the particles under conditions of "size distribution focusing" (16). Co is a more challenging system than CdSe because it has a richer crystal phase diagram with three nearly isoenergetic crystal structures [face-centered cubic (fcc), hexagonal close-packed (hcp), and epsilon].

Rapid injection of organometallic reagents in a hot coordinating solvent produces temporally discrete homogeneous nucleation. The decomposition and nucleation occurs rapidly upon injection. The lifetime of monomers in solution is short, and many small metal clusters (nuclei) form simultaneously. By dynamically coating the particles with a close-packed monolayer of coordinating ligand, the surfactant has the ability to control the size and shape of the growing particles. Through charge transfer, the surface tension is lowered and the growth can be modified. In addition, the surfactant layer prevents the agglomeration of particles, allows monomers to add or subtract, passivates the nanocrystals against oxidation, and defines the minimum interparticle distance. Consistent with the ideas presented above, rods of hcp-Co are obtained in a binary surfactant mixture at early times after injection, and these rods spontaneously transform to more thermodynamically stable spheres of e-Co (9) if they are heated for a sufficient period of time. In these experiments, 0.4 to 0.8 g of $Co_2(CO)_8$ dissolved in 3 ml of o-dichlorobenzene are injected in a refluxing bath of 12 ml of o-dichlorobenzene (182° C.) in the presence of 0.1 to 0.2 ml of oleic acid and 0.1 to 0.3 g of trioctylphosphine oxide (TOPO) (17). As the reaction proceeds in time, the products evolve in a predictable pattern. Thus, quenching the reaction solution after 5 to 10 s yields samples with Co nanorods. In this way, macroscopic samples of size-controlled Co nanorods were produced.

As time evolves over minutes, the high-energy hcp rod-shaped particles disappear at the expense of monodisperse spherically shaped e-Co nanocrystals. The further from equilibrium at the beginning of the reaction, the longer this process takes. Thus, 30 min were necessary to reach final equilibrium for 4 nm by 25 nm rods and up to 60 min in the case of 4 nm by 75 nm rods. Regarding the changes of the crystal structure, it is well known that for these crystal sizes, temperatures of about 200° C. are enough to trigger atom diffusion and phase transitions (18). Even though the hcp structure is the most stable phase for bulk Co at room temperature, experimental data repeatedly show that e-Co is the most often found crystal structure in nanoparticles prepared by wet chemistry (4, 9). The evolution toward a spherical shape is consistent with the high surface tension that reduces the surface-to-volume ratio. The size of the rods or the spheres appears to be determined by the ratio of surfactant to precursor, consistent with observations in CdSe rod growth as well as in other types of spherical metal nanoparticles (19, 20).

Production of Monodisperse Magnetic Colloids of Stabilized Cobalt Nanocrystals

A method for the production of monodisperse magnetic colloids (ferrofluids) of stabilized cobalt nanocrystals, based on the rapid pyrolysis of the organic precursor $Co_2(CO)_8$ in an inert (Ar) atmosphere and in the presence of an organic surfactant (oleic acid, lauric acid, trioctylphosphonic acid and oxide, pyridine, etc.) at high temperatures has been developed. These conditions lead to extremely narrow size distributions, avoiding costly size selective procedures. Colloidal solutions of Co nanocrystals are stable over months, and no evidence for the formation of CoO or $Co_3O_4$ has been observed by x-ray diffraction (XRD), transmission electron microscopy (TEM), or related spectroscopies (EDX, EELS).

The surfactant, by coating the particles with a close-packed monolayer of coordinating ligand, has the ability to control the size of the growing particles. In addition, it prevents their agglomeration, passivates them against oxidation, and defines the interparticle distance in the dried samples. This synthesis was carried out using standard airless procedures and commercially available reagents.

A concentrate solution of $Co_2(CO)_8$ (0.45-0.80 g in 2-3 ml of o-dichlorobenzene anhydrous) was injected in an o-dichlorobenzene anhydrous refluxing bath ~15 ml, T 5181° C.). The decomposition and nucleation occurs instantaneously upon injection. The lifetime of atoms in solution is short leading to the simultaneous formation of many smallmetal clusters (nuclei). The surfactant is present in the hot bath at concentrations of about 1%. Mixtures of oleic acid, lauric acid, pure and technical trioctylphosphine have been used. Control of the bath temperature and the surfactant composition modifies the strength of the metallic particle-organic molecule bonding. Thus, by controlling the precursor/surfactant ratio, the reaction temperature and injection time, the size of the spherical particles can be controlled and varied between 3 and 17 nm. This method produces macroscopic quantities of Co single crystals that are monodisperse within the limit of atomic roughness. These particles are stable in air.

Hollow Nanoparticles

Carbon buckyballs are only one example of hollow nanoparticles. Up to now, more than 30 other materials which are similarly layered were prepared as hollow nanoparticles (either spherical or cylindrical), including, e.g., the metal dichalcogenides $MX_2$ (M=W, Se, X=S, Se), BN, GaAs, and CdSe [14]. In fact, the formation of closed structures is generic for anisotropic layered materials of finite size due to the line tension resulting from dangling bonds. Effective pair potentials for such hollow nanoparticles are isotropic for spherical shapes, but still depend on their radius R and thickness h. In particular, for carbon onions and hollow metal dichalcogenides nanoparticles (inorganic fullerenes) the thickness h can vary because the particles are multiwalled. Carbon onions with hundreds of shells have been observed [15]. Onions are formed by metal dichalcogenides with up to 20 shells [16]. In both cases, outer radii R can reach 100 nm, that is several orders of magnitude more than buckyballs with R=3.55 Å.

Modified Polyol Process

The so-called modified "polyol" process has been used for preparation of bi- and trimetallic magnetic nanocrystals.[29-31,33,34] In all cases, the reduction of platinum acetylacetonate with a long-chain polyol in the presence of stabilizers was combined with the simultaneous thermal decomposition of cobalt or iron carbonyl. As a result, alloyed particles with a narrow distribution were obtained. Farrell et al.[54] used tiny particles of platinum as nuclei for further synthesis of monodisperse iron particles. Afterwards, the metallic platinum particles are not extracted from the solution and investigated.

A two-stage procedure for the preparation of bimetallic Pt@Co particles has been developed. Pure platinum particles with definite diameter were formed at first. Later, decomposition of cobalt carbonyl on the Pt seeds, if carried out at relatively low temperature, aborts formation of any alloy yielding only Pt-core/Co-shell particles. A typical synthesis is described in detail below.

In a three-necked round-bottom flask, a solution of platinum acetylacetonate (99.99%, Aldrich, 0.05 g or 0.125 mmol), 1,2-hexadecanediol (90%, Aldrich, 0.1 g or 0.38 mmol), oleic acid (99+%, Aldrich, 40 μL or 0.125 mmol), and oleylamine (70%, Aldrich, 56 μL or 0.175 mmol) in 5 mL of diphenyl ether (dpe) was heated to 205° C. After heating for 60 min, the dark mixture was cooled to 142° C., and the solution of the designed amount of dicobalt octacarbonyl $Co_2(CO)_8$ (contains 1-5% hexane as stabilizer, Alfa Aesar) in dpe was gradually added under a nitrogen atmosphere. Mixing and heating at this temperature was then continued for 30 min. The resulting dispersion was left to cool to room temperature, and ethanol was added to precipitate the particles. After removal and drying of the supernatant, the magnetic particles were redispersed in toluene. Use of other nonpolar solvents such as hexane, octane, or chloroform is possible as well.

The structure of the particles was assessed by a transmission electron microscope Philips 12CM, operating at 120 kV, which was equipped with an X-ray fluorescent analyzer for the determination of the material compositions. Samples were prepared by drying a drop of the solution on a thin (5 nm) carbon-film-covered copper grid. The size distribution of the particles was measured from TEM images with at least 200 particles. The UV-visible spectra were recorded on a Bruins spectrophotometer with correction for toluene background absorption. The magnetic measurements were made on a commercial superconducting quantum interference magnetometer (SQUID) from Quantum Design for the M-H loops and from SHE for susceptibility measurements. M-H loops were taken for samples prepared by drying several drops of solution on a Si/SiO2 substrate, while the zero-field-cooled (ZFC) and field-cooled (FC) data were taken for the liquid solution.

What is claimed is:

1. A hollow nanocrystal, comprising: a nanocrystal shell having a thickness of at least 0.5 nm, said nanocrystal shell enveloping an empty space and lacking a core, wherein, said nanocrystal shell forms a continuous three dimensional domain adopting a three dimensional arrangement of atoms in contrast to molecular sheets and is not perfectly single crystalline.

2. The hollow nanocrystal as claimed in claim 1, wherein: the shell thickness is between about 0.5 nm and 100 nm.

3. The hollow nanocrystal as claimed in claim 2, wherein: the shell thickness is between about 2 nm and 80 nm.

4. The hollow nanocrystal as claimed in claim 3, wherein: the shell thickness is between about 3 nm and 10 nm.

5. The hollow nanocrystal as claimed in claim 1, wherein: the shell comprises a material selected from the group consisting of Pt, ZnS, ZnSe, ZnTe, ZnO, CoO, $Co_3O_4$, $Fe_2O_3$, FeP, $Fe_3O_4$, FeO, $TiO_2$, CdS, CdSe, CdTe, HgS, HgSe, HgTe, MgTe, GaN, GaP, GaAs, GaSb, InN, InP, InAs, InSb, AlAs, AlP, AlSb, AlS, $Co_9S_8$, $Co_3S_4$, CoSe, GaMnAs, GaInN and InAsN.

6. The hollow nanocrystal as claimed in claim 1, wherein: the shell comprises a material selected from the group consisting of $Co_9S_8$, $Co_3S_4$, CoO, $Co_3O_4$, CoSe, CdS, $Fe_2O_3$, CdSe and Pt.

7. The hollow nanocrystal as claimed in claim 5, wherein: the shape of the hollow nanocrystal is either spherical, branched, tubular or disk.

8. The hollow nanocrystal as claimed in claim 7, wherein: the shape of the nanocrystal is spherical, and the outside diameter is between about 1 nm and 1000 nm.

9. The hollow nanocrystal as claimed in claim 8, wherein: the outside diameter is between 1 nm and 500 nm.

10. The hollow nanocrystal as claimed in claim 9, wherein: the outside diameter is between 5 nm and 100 nm.

11. The hollow nanocrystal as claimed in claim 10, wherein: the outside diameter is between 10 nm and 50 nm.

12. The hollow nanocrystal as claimed in claim 11, wherein:
the outside diameter is between 10 nm and 30 nm.

13. The hollow nanocrystal as claimed in claim 1, wherein:
the hollow nanocrystal shell comprises a binary or ternary compound, wherein said binary and/or ternary compound comprises a first material and a second material, wherein:
the first material comprises a material selected from the group consisting of Pt, Zn, Co, Fe, Ti, Cd, Hg, Mg, Ga, In, Al, Ni, Sn and Bi; and the second material is selected from the group consisting of S, Se, O, P, N, F, Cl, I, Br, As and Sb.

14. The hollow nanocrystal as claimed in claim 13, wherein:
the diffusion rate for the first material is different than the diffusion rate for the second material.

15. The hollow nanocrystal as claimed in claim 7, wherein:
the nanocrystal has a disk shape, and the outside diameter is between about 10 nm to about 200 nm.

16. The hollow nanocrystal as claimed in claim 15, wherein:
the outside diameter is between about 10 nm and 100 nm.

17. The hollow nanocrystal as claimed in claim 15, wherein:
the outside diameter is between about 25 nm and 50 nm.

18. The hollow nanocrystal as claimed in claim 7, wherein:
the nanocrystal has a tubular shape, and the length is between about 30 nm to about 500 μm.

19. The hollow nanocrystal as claimed in claim 18, wherein:
the length is between about 50 nm and 200 μm.

20. The hollow nanocrystal as claimed in claim 19, wherein:
the length is between about 50 nm and 20 μm.

21. A method of making a hollow nanocrystal, comprising providing a nanocrystal comprising a first material,
reacting the nanocrystal with a second material,
wherein the first and second material react to form a shell of a hollow nanocrystal that forms a continuous three dimensional domain adopting a three dimensional arrangement of atoms in contrast to molecular sheets and is not perfectly single crystalline, and wherein said hollow nanocrystal shell enveloping an empty space and lacking a core.

22. A method of making a hollow nanocrystal as claimed in claim 21, wherein: the first material comprises a material chosen from the group consisting of Al, Ga, In, Tl, Sn, Pb, Bi, Po, Sc, Ti, V, Cr, Mn, Fe, Co, Ni, Cu, Y, Zr, Nb, Mo, Tc, Ru, Rh, Pd, Ag, Cd, La, Hf, Ta, W, Re, Os, Ir, Pt, Au, Hg, Li, Na, K, Rb, Cs, Be, Mg, Ca, Sr, Ba, Ge, Si, Se, Te, FeCo, CoNi and CdZn.

23. A method of making a hollow nanocrystal as claimed in claim 21, wherein: the second material comprises a material chosen from the group consisting of S, O, Se, Te, P, N, As, Cl, I, Br and Bi.

24. A method of making a hollow nanocrystal as claimed in claim 23, wherein: the second material comprises a material chosen from the group consisting of S, O, Se and Te.

25. A method of making a hollow nanocrystal as claimed in claim 21, wherein: the second material comprises sulfur in solution, and the second material is combined with a solution containing the first material to make a sulfide hollow nanocrystal.

26. A method of making a hollow nanocrystal as claimed in claim 21, wherein: the second material comprises O, and a gaseous mixture containing the second material is combined with a solution containing the first material, thereby making a oxide hollow nanocrystal compound.

27. A method of making a hollow nanocrystal as claimed in claim 21, wherein: the second material comprises O, and and the second material is in solution and is combined with a solution containing the first material, thereby making an oxide hollow nanocrystal compound.

28. A method of making a hollow nanocrystal as claimed in claim 21, wherein a substantial fraction of the first material reacts with the second material to form a shell of a hollow nanocrystal.

29. A method of making a hollow nanocrystal as claimed in claim 21, wherein the first material reacts with the second material to form a shell of a hollow nanocrystal in a single step reaction.

30. A method of making a hollow nanocrystal, comprising:
providing a nanocrystal comprising a first material,
reacting the nanocrystal with a second material,
wherein a substantial fraction of the first material reacts with the second material to form a shell of a hollow nanocrystal in a single step without additional material removal steps, and wherein said hollow nanocrystal shell enveloping an empty void or multiple voids wherein, said nanocrystal shell forms a continuous three dimensional domain adopting a three dimensional arrangement of atoms in contrast to molecular sheets and is not perfectly single crystalline.

31. The method as claimed in claim 30, wherein the first material comprises a material selected from the group consisting of Pt, Zn, Co, Fe, Ti, Cd, Hg, Mg, Ga, In, Al, Ni, Sn and Bi; and the second material is selected from the group consisting of S, Se, O, P, N, F, Cl, I, Br, As and Sb.

32. The method as claimed in claim 30, wherein the hollow nanocrystal shell formed comprises a binary or ternary compound, wherein said binary and/or ternary compound comprises the first material and the second material.

33. A hollow nanocrystal made by the method of claim 21 comprising a nanocrystal shell of at least 0.5 nm thickness, said nanocrystal shell enveloping a void or multiple voids, wherein said nanocrystal shell is not comprised of discrete molecular sheets.

\* \* \* \* \*